United States Patent [19]
O'Connor-d'Arlach et al.

[11] 3,953,879
[45] Apr. 27, 1976

[54] CURRENT-LIMITING FIELD EFFECT DEVICE

[75] Inventors: Jorge O'Connor-d'Arlach, Cochabamba, Bolivia; Clifton G. Fonstad, Jr., Cambridge, Mass.

[73] Assignee: Massachusetts Institute of Technology, Cambridge, Mass.

[22] Filed: July 12, 1974

[21] Appl. No.: 488,610

[52] U.S. Cl. .................................. 357/22; 357/55; 357/56; 357/60; 357/86; 307/251
[51] Int. Cl.² .................. H01L 29/80; H01L 29/06; H01L 29/04
[58] Field of Search .................. 357/22, 21, 60, 63, 357/55, 56; 307/86, 251

[56] References Cited
UNITED STATES PATENTS

| | | | |
|---|---|---|---|
| 3,482,151 | 12/1969 | Teszner et al. | 357/22 |
| 3,657,573 | 4/1972 | Maute | 357/22 |
| 3,767,982 | 10/1973 | Teszner et al. | 357/22 |
| 3,813,585 | 5/1974 | Tarui et al. | 357/22 |
| 3,814,995 | 6/1974 | Teszner | 357/22 |
| 3,841,917 | 10/1974 | Shannon | 357/22 |
| 3,855,608 | 12/1974 | George et al. | 357/22 |
| 3,855,609 | 12/1974 | Magdo et al. | 357/22 |

Primary Examiner—Andrew J. James
Attorney, Agent, or Firm—Arthur A. Smith, Jr.; Robert Shaw; Martin M. Santa

[57] ABSTRACT

A field effect semiconductor device that has particular use in limiting current in electric circuits over a very wide power range. In a preferred form, the device consists of a crystalline-material semiconductor wafer having multiple channels at one major surface thereof, the channels being separated by grooves formed along parallel crystallographic planes of the crystalline material. The wafer material forming each of the channels is lightly doped and each channel is bounded by flat walls, parallel to one another and formed by highly doping the wafer material with a dopant that is opposite in type to that of the channels. All said one major surface of the wafer is highly doped with the opposite-type dopant to that of the channels with the exception of ohmic-electric-contact regions of each channel, which regions are highly doped with the same-type dopant as that of the channels. All said one surface, except at the edge or edges thereof, is covered by a first conductive terminal. The part of the wafer between the vicinity of the channels and the other major surface is highly doped with the same-type dopant as that of the channels. A second conductive terminal covers said other major surface, again with the exception of the edge or edges. Each terminal makes low-resistance contact with the wafer. The edges of the wafer and the sides thereof are covered by an electrically-insulating, chemically-passivating heat resistant mechanical covering. Each of the channels acts as a field effect transistor with its gate shorted to the first terminal.

39 Claims, 12 Drawing Figures

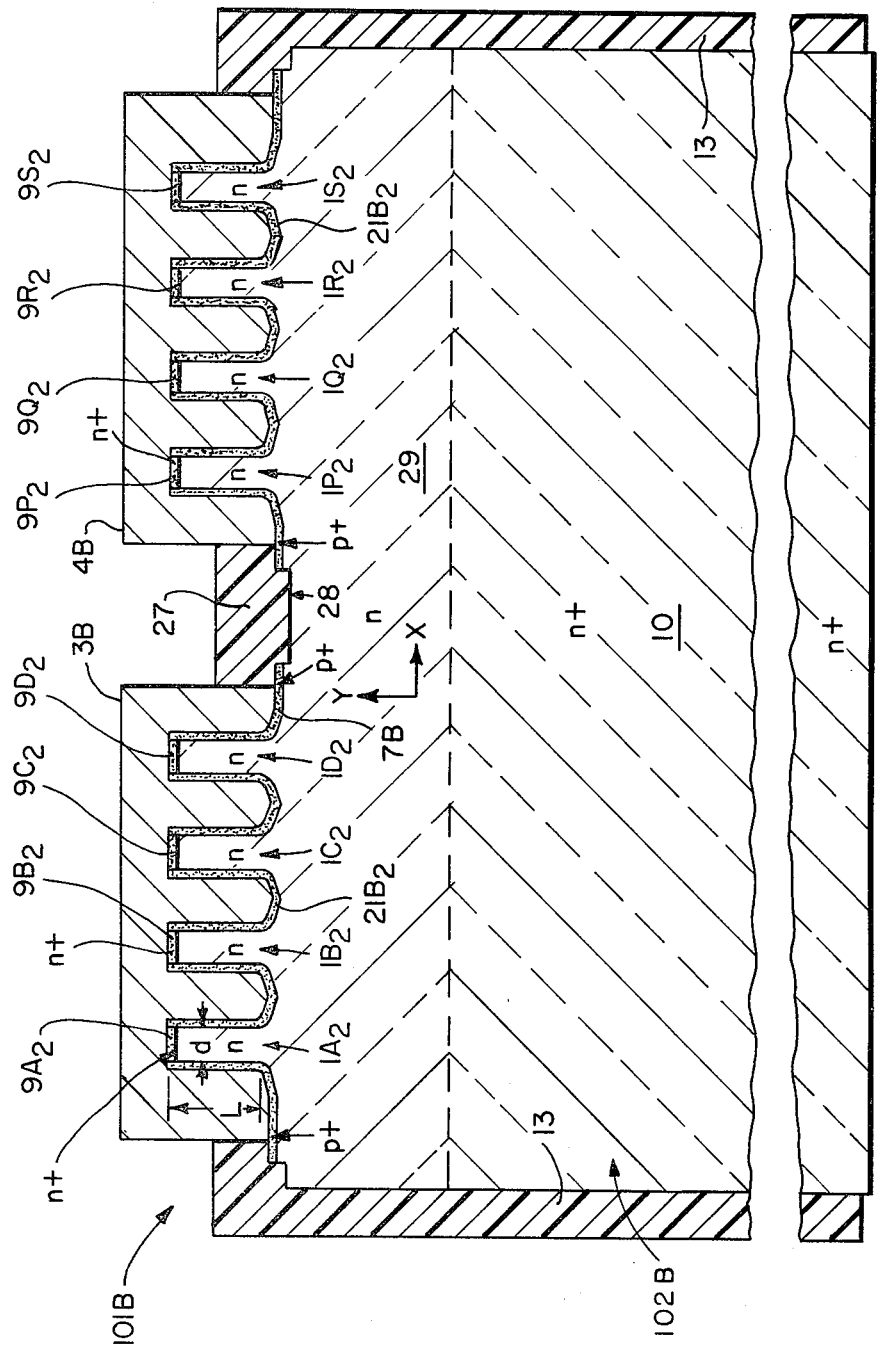

CURRENT-LIMITING FIELD EFFECT DEVICE

The present invention relates to field effect devices and, in particular, to field effect devices for use as current-limiting devices in electrical circuits over a very wide power range.

Attention is called to Bolivian Pat. No. 3302 granted Aug. 28, 1973 to Jorge O'Connor D'Arlach, one of the present inventors, as well as to the following U.S. Pat. Nos. 3,027,466; 3,147,399; 3,369,129; 3,483,270; 3,521,087; 3,529,210; 3,532,899; 3,555,361; and 3,651,340.

There accompanies herewith a writing entitled "A New Current-Limiting Device" authored by one of the present inventors but reporting on work done by both. Some portions of the writing are contained in the instant specification, but others are not. Comment is made there of the need in electric power circuits for circuit elements adapted to limit transient currents in such circuits but to have minimal effect in normal or steady-state circuit operation. Essentially, what is needed is a circuit element or device that has a small resistance when a steady-state current passes through it but a high resistance during transient conditions. To be useful at all, such device in addition, must have a large current-carrying capacity when needed, a breakdown voltage much higher than the voltage drop across its terminals during steady-state conditions as well as the pinch-off voltage, be automatic in operation, and be dependable.

Accordingly, it is an object of the present invention to provide a device having the foregoing characteristics.

Another object is to provide the rugged characteristics required for power devices yet in circuit elements that can be mass produced giving cost savings inherent in such mass production as well as savings due to simplicity of fabrication.

Still another object is to provide an electric system that employs such devices which can be connected in the system in series and/or parallel configurations.

These and still further objects are made apparent hereinafter.

The foregoing objects are attained by a field effect device having a plurality of channels each of which acts as a field effect transistor with its gates shorted to one of its terminals and which together constitute the device that performs the required functions. The geometry of the channels, together with doping levels and placement of the active parts of the device, acts, during pre-determined high level currents, to cause saturation and, thus, pinch-off of the current being conducted, thereby limiting the current in the electric circuit of which the device is a part. Although the device can have more than one geometry, that which appears best for present purposes is a geometry that consists of vertical channels separated from one another by grooves, the channels and grooves being disposed at the first major surface of a crystalline-material, semiconductor wafer, the second major surface of which is that of the wafer substrate. Each channel consists of a lightly-doped portion of the wafer bounded by flat walls formed along parallel crystallographic planes of the crystalline material, the planes being perpendicular to the first major surface. The walls are made by highly doping the material region between the grooves and the channels thereby forming a gate region, the dopant in the gate region being opposite to that of the channels. A first electrical terminal covers the whole of the first major surface (except at and near the edge or edges thereof), filling the grooves, and making low-resistance contact with each of the channels through a thin layer of highly doped crystalline material with the same dopant as that of the channels, as well as the gate regions thereof. A second electrical terminal covers the whole of the second major surface (except at and near the edge or edges thereof). The substrate consists of a highly doped region of the wafer between the vicinity of the channels and the second major surface and containing the same-type dopant as the channels. The terminals do not extend onto the side regions of the wafer.

The invention is hereinafter discussed with reference to the accompanying drawing in which:

FIG. 5 is a vertical section view of a modification of the device of FIG. 3A and having two terminals at the top thereof;

Figure 1:
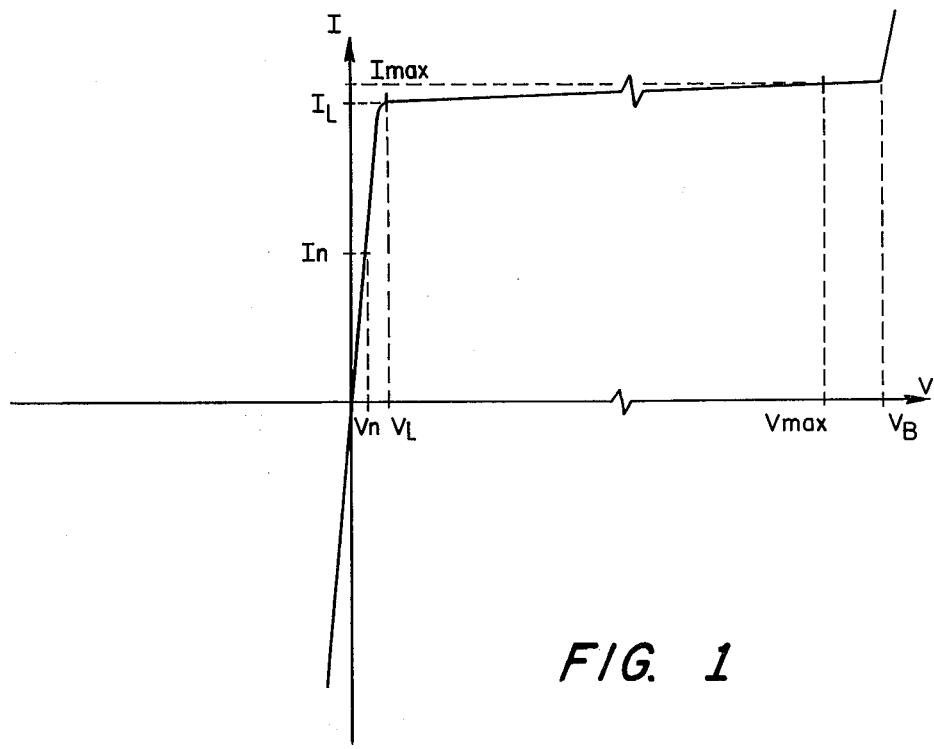
FIG. 1 is current-voltage characteristic of the type exhibited by the current-limiting devices herein disclosed.
Figure 2:
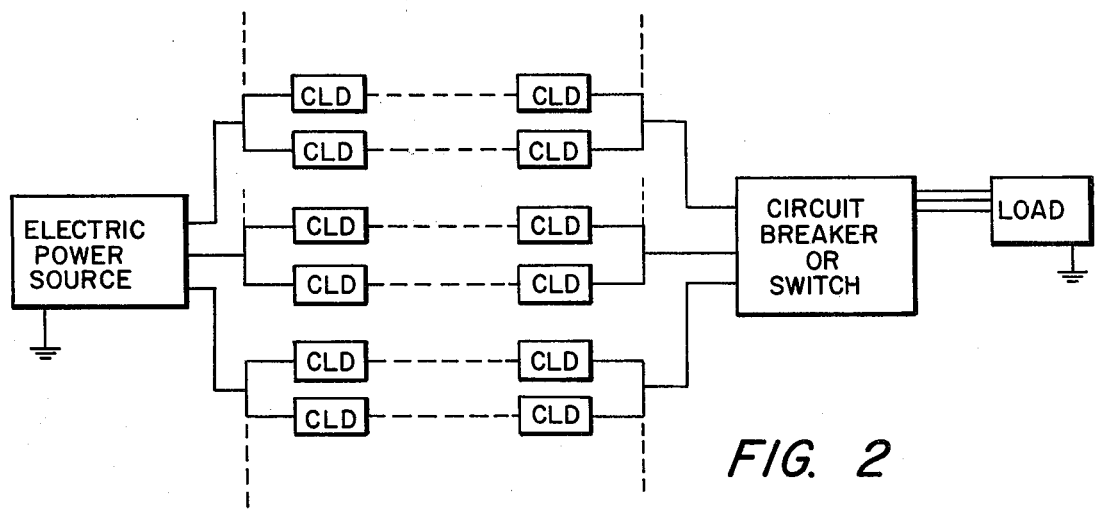
FIG. 2 is a circuit diagram, in block diagram form and showing a polyphase system employing a plurality of said devices in each phase.
Figure 3A:
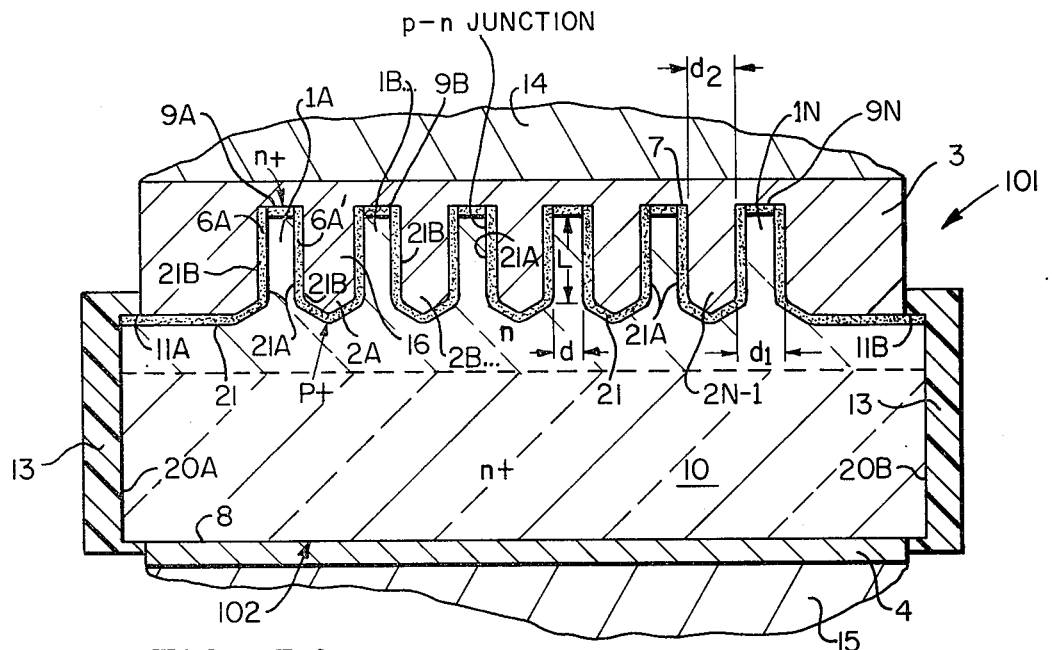
FIG. 3A is a vertical section view of a preferred form of the device, showing N vertical channels (where N=six) that have been formed in a crystalline-material wafer by preferential chemical etching techniques, said device having grooves that separate the channels, an upper terminal and a lower terminal to provide electric connection thereto, and a gate region between the grooves and the channels.
Figure 4A:
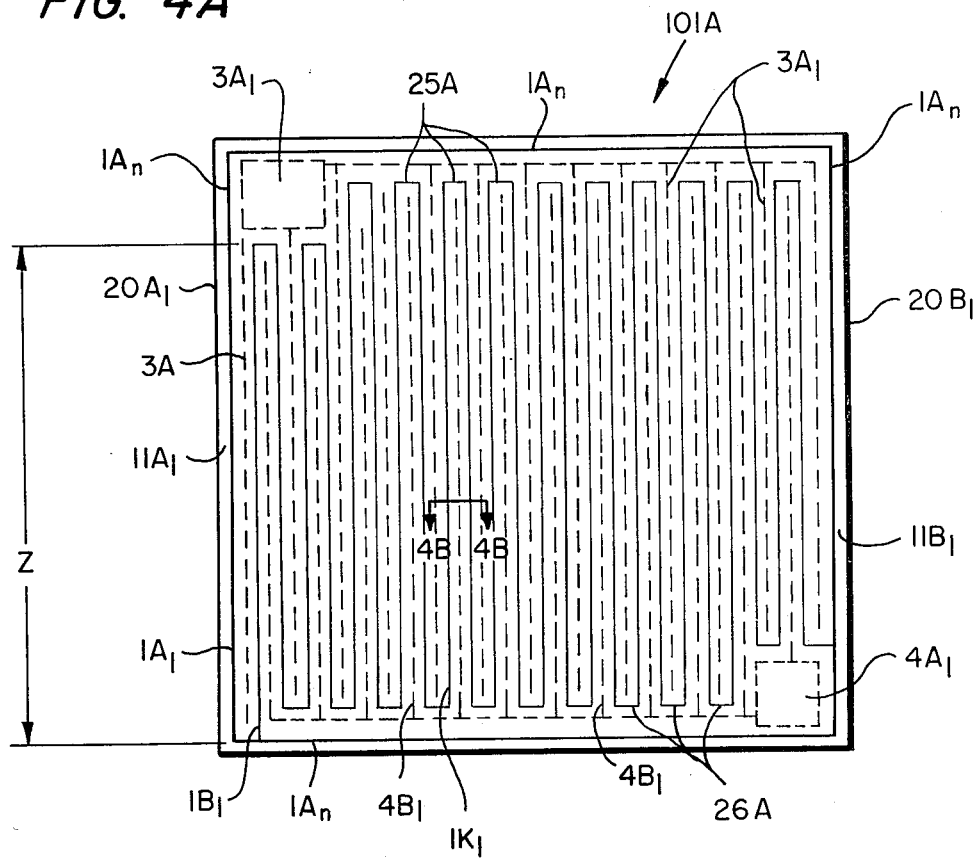
FIG. 4A is a top schematic representation of another form of the device and shows horizontal-channel construction using planar techniques.
Figure 4B:
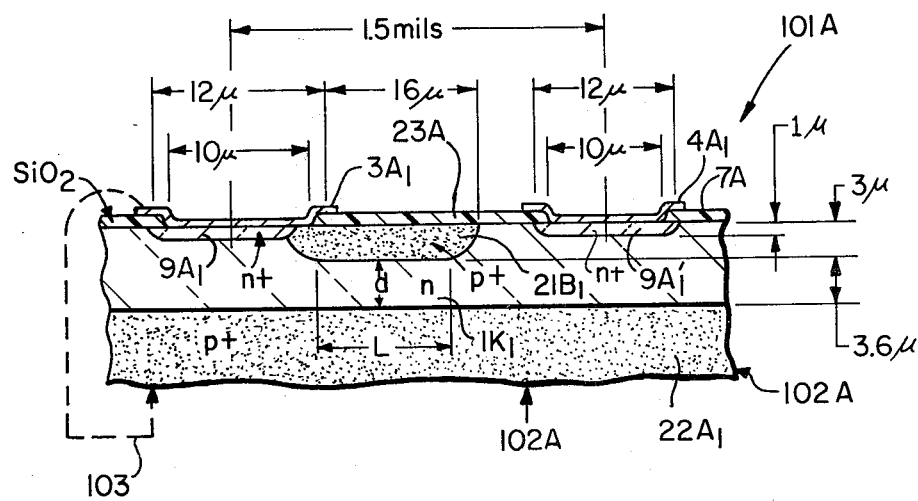
FIG. 4B is a greatly enlarged view taken upon the line 4B—4B in FIG. 4A, looking in the direction of the arrows.
Figure 7:
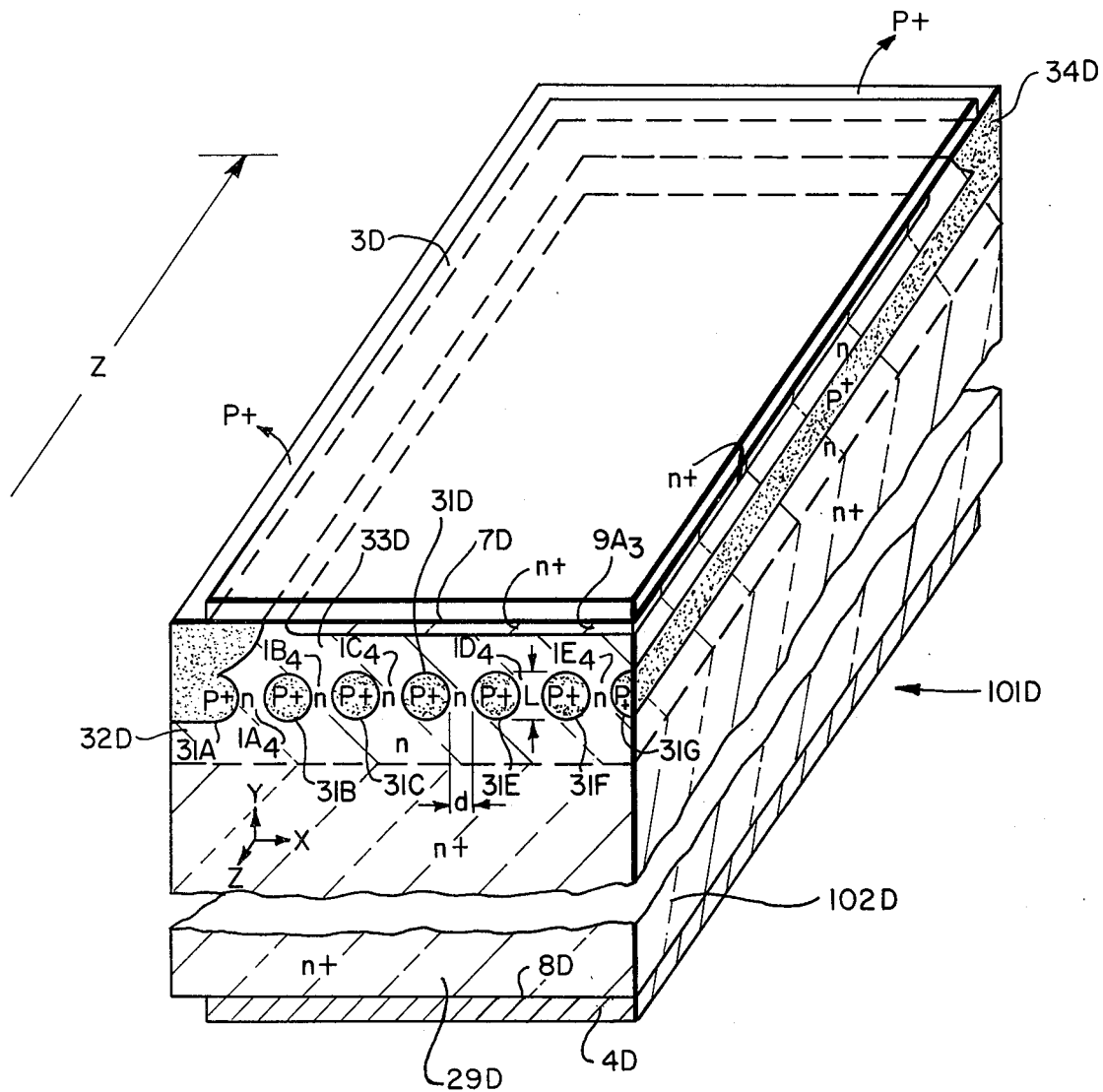
FIG. 7 is an isometric view of a vertical-channel, two terminal device, like the device of FIG. 3A, except that the channels and the gates are buried within the bulk of the wafer and the wafer is not grooved, the device of FIG. 7 being formed by diffusion and epitaxial overgrowth techniques.

Before going into a detailed discussion of the invention, some general comments are in order. As above noted, the devices herein disclosed are intended to limit current in a circuit under transient conditions but to have minimal effect on the circuit during conditions of normal circuit operations. Desired current-voltage characteristics are shown in FIG. 1; a plurality of such devices, in a series and parallel circuit configuration, is included in the electric system shown schematically in FIG. 2, between a source of electric energy and a load. Semiconductor devices to perform the required functions are two-terminal, multi-channel, field effect devices with the gate of each shorted to one of the two terminals (source or drain), except for the device of FIGS. 9A and 9B which as three-terminals. The devices can have planar horizontal channels as shown in FIGS. 4A and 4B, vertical channels with epitaxial overgrowth as shown in FIG. 7, or the vertical channels of FIG. 8 fabricated by ion implantation. The preferred form of device for present purposes is that shown at 101 in FIG. 3A and that device is discussed in greatest detail in what follows. It will be appreciated by workers skilled in the art to which this specification is directed, that the p and n regions of the devices discussed can be interchanged. In this specification in the various illustrative embodiments, an attempt is made to apply the same or similar designations to the various parts of the devices that perform the same or similar functions in each.

Figure 3B:
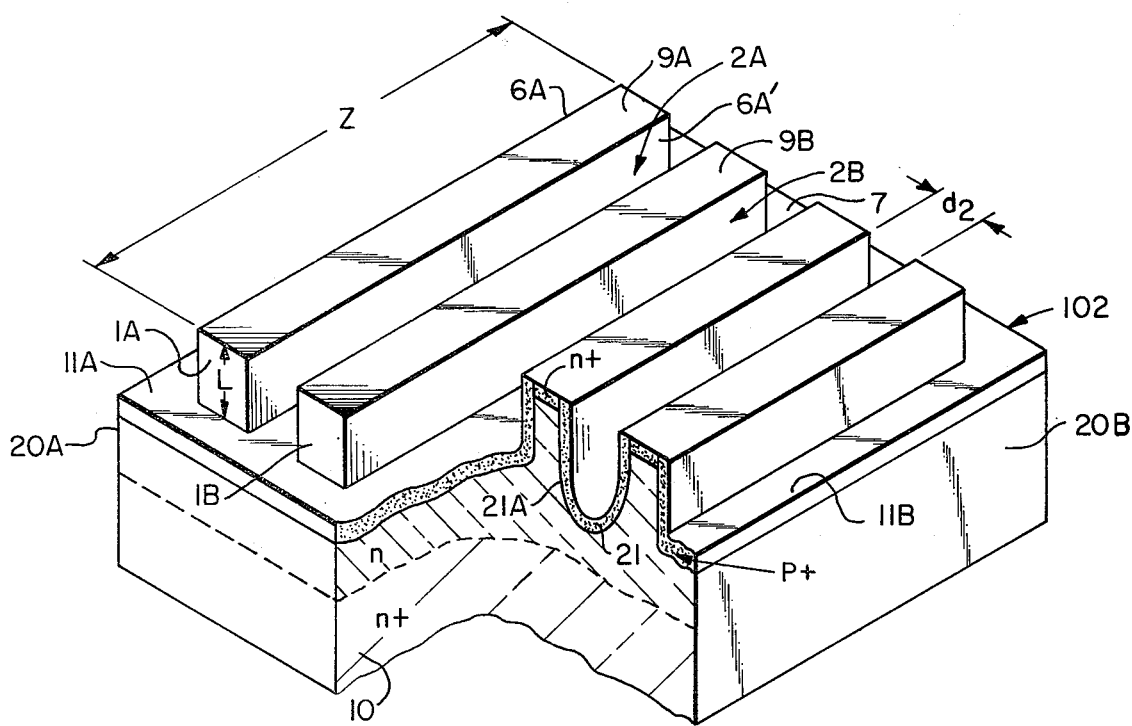
FIG. 3B is an isometric, partial view, partly cutaway, of a part of a device, like the device of FIG. 3A, but having four vertical channels.

The elemental-current-limiting device 101 comprises a crystalline-material, semiconductor wafer 102 having at one major surface 7 thereof, a plurality of vertical source-to-drain channels 1A, 1B ... 1N separated from each other by grooves 2A, 2B ... 2N-1 in FIG. 3B; the grooves in FIG. 3A, as later noted, are filled with metal (see the metallic finger labeled 16 in FIG. 3A) forming a first conductive terminal 3, the other or second conductive terminal being that shown at 4 at the other major surface labeled 8. The grooves 2A, 2B ... are formed along crystallographic planes of the crystalline material of which the wafer 102 is made. Each channel is bounded by flat walls such as, for example, the walls labeled 6A and 6A' at either side of the channel 1A, the walls 6A and 6A' being substantially orthogonal to the major surface 7. The crystalline material of which the channels consist is lightly doped and the walls contain a high level of an opposite-type dopant, thereby forming the gate region of the device 101. In FIGS. 3A and 3B the mesa-like channels contain an n-type dopant and the walls a p-type dopant. All the major surface region 7 of the wafer 102 with the exceptions of low-resistance, ohmic-electric-contact regions 9A, 9B ... 9N to respective channels 1A, 1B ... 1N, is highly doped with the same dopant as the walls, that is, $p^+$-type dopant, that forms the layer generally designated by the number 21. The regions 9A, 9B ... 9N are thin, highly doped layers with the same dopant as that of the channels and form the entrance to or the exit from the associated channel for current. (It will be appreciated at this juncture that the terms "entrance" and "exit" are for convenience only and denote a low-resistance electrical contact; also, an "entrance" as applied to current is an "exit" as applied to electron flow; and in a-c circuits the roles alternate.) The layers 9A ... are orthogonal to the walls of the channel, as shown.

There is between the region of the channels and the second electrical terminal a substrate 10 that is a highly doped portion of the wafer 102, the dopant being the same type as that of the channels; and there is a lightly doped region of the same-type dopant (i.e., n-type dopant) as that of the channels, between the channels, and the substrate. The first and second metallic terminals 3 and 4 cover and make low-resistance ohmic contact with all the surfaces 7 and 8 but do not extend over and onto the edge or edges labeled 11A and 11B of the wafer; that is, the terminals do not extend as far as the sides shown at 20A and 20B of the wafer 102. An electrically insulating, chemically passivating, and heat resistant mechanical covering 13 covers the edge or edges of the wafer, as well as the sides thereof, and mechanically interconnects the first metallic terminal 3 to the second metallic terminal 4. Heat sinks 14 and 15 (or other cooling means) are provided when necessary.

In FIG. 3A and 3B the channel length is labeled L, the width Z and the thickness $d$; the channels are separated from one another by the grooves of cross dimension $d_2$; and the overall cross-dimension of a channel and two gate regions is $d_1$. Each of the channels acts as a field effect transistor with its gate, that is, the $p^+$ walls labeled 21B bounding the particular channel, shortened to the first metallic terminal 3. The two-terminal device 101, thus formed, to perform the desired function should have a ratio $L/d \geq 4$; lower ratios (i.e., $L/d \geq 3$) can be used but performance is degraded. The device 101 has a low electrical resistance between its terminals 3 and 4 when it is not limiting current; it has very high resistance when it is limiting current; it has a breakdown voltage $V_B$ (in FIG. 1) much greater than its normal operating voltage $V_n$ (i.e., the voltage drop between its terminals when it is not limiting current) and its pinch-off voltage $V_L$. The current characteristics of FIG. 1 are influenced greatly by the ratio and the level of doping in the channels, $L/d$ the other factor being the parallel walls 21B of the channels and the magnitude of $d$. The current-carrying capacity is determined mostly by the ratio $Z/L$ (the ratio $Z/L$ must be very large for present purposes; in an N-channel device the ratio $NZ/L \geq 100$ and preferably $NZ/L \geq 1000$), although the dimension $d$ and doping levels enter this also. And the breakdown voltage is determined by the shape of p-n junctions 21A and the doping level of the channels. The $p^+$ layer 21 in the channel walls performs a gating function whereas between the terminal 3 and the bulk of the wafer, it performs a blocking or insulating function when the current is flowing in the direction in which the device can limit it. The p-n junctions 21A in the device 101 is disposed adjacent the terminal 3, thereby providing optimal cooling. The terminals 3 and 4 can be made massive enough to act, in some circumstances, as heat sinks. In order to place this explanation in proper context, there now follows an analysis of the device 101, that is followed by examples which give typical parameters for such device and the examples are followed by instructions relating to fabrication of a device 101.

If in the device shown in FIGS. 3A and 3B, $L \geq 4d$, then the device will behave as predicted by Shockley's theory. If $I_L/N_1 = I_n$, where $N_1$ is any positive number greater than one (typically two) and remembering that in the device there is always a zero bias on the gate, then according to Shockley's theory:

$$I_L/N_1 = I_n = (NZ/L)\mu_n q\, N_D d \{V_n - \tfrac{2}{3} \sqrt{\frac{8K_s\epsilon_0}{qN_D d^2}} [(V_n + \phi_B)^{3/2} - \phi_B^{3/2}]\} \qquad (1)$$

Also, when the voltage across the terminals is $$V_L = (qN_Dd^2/8K_s\epsilon_o) - \phi_B,$$

then $I = I_L$ and $$I_L = \left(\frac{NZ}{L}\right) q\mu_n N_D \cdot d\{qN_Dd^2/8K_s\epsilon_o - \phi_B$$
$$-\tfrac{2}{3} \sqrt{8K_s\epsilon_o/qN_Dd^2} [(qN_Dd^2/8K_s\epsilon_o)^{3/2} - \phi_B^{3/2}]\}, \quad (2)$$

where
- $q$ = Magnitude of electronic charge = $1.6 \times 10^{-19}$ coulomb
- $K_s$ = Dielectric constant = 11.7 for silicon
- $\phi_B$ = Built-in voltage of the pn junctions
- $\mu_n$ = Mobility of electrons = 1350 for silicon = 3900 for GaAs
- $N_D$ = Donor concentration in the channel region
- $\epsilon_o$ = Permittivity of free space = 55.4 electronic charge/V$\mu$ From equations (1) and (2) it follows that $$d^3 - 3\left(\frac{8K_s\epsilon_o}{qN_D}\right)(N_1V_n + \phi_B)d$$
$$+ 2\left(\frac{8K_s\epsilon_o}{qN_D}\right)^{3/2}[N_1(V_n + \phi_B)^{3/2} - (N_1-1)\phi_B^{3/2}] = 0. \quad (3)$$

From equation (3), three real and different values for $d$ are obtained. The solution will be the value of $d$ which is positive and yields $V_L > V_n$. (The above analysis is also pertinent to the other devices hereinafter discussed.) Two examples are now given of silicon and GaAs devices constructed in the manner shown in FIGS. 3A and 3B.

EXAMPLE 1

The values given below for this example are for a silicon wafer and assume the one side step approximation for the junctions. In this example
$N_1 = 2$; $V_n = 0.5$ volts; $N_D = 10^{15}$cm$^{-3}$; and
$N_A = 10^{17}$cm$^{-3}$ (concentration in the p+ region).
If a junction curvature of $3\mu$ is assumed, there is a breakdown voltage of $V_B = 85$ Volts. A value Vmax = 70 volts is chosen and a safety factor of approximately 1.21. The built-in voltage in the $pn$ junctions at room temperature will be $$\phi_B = (kT/q) \ln(N_AN_D/n_i^2) = 0.6829525074 \text{ V}. \quad (4)$$

Placing all the foregoing values in equation (3), the following values are obtained:
$d = 3.6119\mu$
$V_L = 1.8329$V
$I_n = Z/L \; 1.5326 \times 10^{-5}$A
$I_L = Z/L \; 3.0652 \times 10^{-5}$A.

EXAMPLE 2

If the same conditions set forth in Example 1 prevail, but GaAs is used, then
$N_1 = 2$, $V_n = 0.5$V, $N_A = 10^{17}$cm$^{-3}$, $N_D = 1.396011 \times 10^{15}$cm$^{-3}$, and
$d = 3.3187\mu$
$V_L = 1.8034$V
$I_n = Z/L \times 10.2254 \times 10^{-5}$A
$I_L = Z/L \times 20.4507 \times 10^{-5}$A.
Examples 1 and 2 show the two following general conditions:

a. In order to have a small power loss during "normal" conditions the channels of the specially designed semiconductor circuits must have a small d and a value of $N_D$ that is not very large, and b. in order to have reasonable values of $I_n$, the ratio Z/L must be very large.

A method of construction in silicon a device of the type shown in FIGS. 3A and 3B, now follows:

a. Start with a silicon $n$ on $n+$ epitaxial wafer having a (110) surface orientation.

b. Diffuse an $n$-type impurity such, for example, as phosphorus to obtain shallow $n+$ regions in the top and bottom of the wafer.

c. Perform oxidation on the wafer in order to cover it with a protective layer of SiO$_2$.

d. Using the photoresist technique, leave rectangular strips of SiO$_2$, of cross dimension $d_1$ and width Z, separated by the distance $d_2$; the long side of the openings must be aligned with the (111) crystallographic planes.

e. Etch vertical grooves in the silicon, of width $d_2$, aligned with (111) planes; this can be done by etching with a mixture of 100g of KOH in 100 cc of H$_2$O at a temperature near the boiling point of water. (See an article by A. I. Stoller entitled "The Etching of Deep Vertical-Walled Patterns in Silicon", RCA Review, June, 1970, pp. 271–275.)

f. Diffuse boron and drive in, in order to obtain a p+ layer like that shown in FIG. 3A.

g. Etch the oxide remaining in the wafer.

h. Remove p+ skin from bottom of wafer. This can be done by dipping in concentrated HF for 2–3 seconds. Rinse in de-ionized water and etch in a 6-1-1 solution of HNO$_3$—HF—HAC (the duration of the etching depends on the thickness of the p+ layer; it will be in the range of 60 seconds for a thickness of $2\mu$). The removal of the p+ layer on the bottom of the wafer should be carried out when it is intended to have current flowing between the top and bottom of the wafer.

i. Perform metalization to form the flat metallic contacts or terminals 3 and 4. This could be done by forming a layer by aluminum evaporation, or sputtering. A metal mask can be used to define the area of metalization, which can be a big area going almost to the edge of the wafer, if it is desired to fabricate large power devices, or many smaller areas if it is desired to make smaller devices in a wafer. After alloying the aluminum to the silicon, the contacts are made thicker as shown in FIG. 3A in order to obtain flat contacts, a mechanically strong configuration, and heat storing capacity that is useful during transients. This can be done by any procedure which will produce flat metallic contacts, like sputtering and soldering.

As is noted above, the channel dimensions are determined by the current voltage characteristics required of the device 101 for a particular circuit. The magnitude of $d_2$, however, is determined by thermal considerations. A detailed analysis of the thermal characteristics of the device is contained in said writing, and is not repeated here. It is interesting to note that the device 101 with its vertical channels and grooves permits fabrication of a structure having precisely determinable current-voltage characteristics, but it permits as well, a structure with good thermal characteristics since the metal in the grooves is so near the p-n junction 21A; and, in many situations of interest, the terminal 3 can be made sufficiently massive to fulfill thermal dissipation needs which are not great in a well-designed system since transient currents can be limited to values two to three times normal and dissipation in the device, during normal conditions, is small.

It should be understood that the examples given above are general in nature and that channel size, groove size, etc., will vary to meet circuit requirements. Work done to date has resulted in grooves $2A \ldots$ with V-shaped bottoms but a semicircular bottom would be better: in such case the radius of curvature of the junction could be increased without increasing the depth of boron diffusion, that is, the thickness of the layer 21.

The device 101 relates to a device made from an n-type wafer, but a p-type wafer can be used, as previously noted. It is better to start with epitaxial wafers, n on n+ or p on p+, to reduce the ohmic resistance of the substrate.

The device 101 will limit current in one direction only: in an a-c system, two such devices can be employed in series — back-to-back or vice versa — or the two can be combined in a single device. However, a single device 101B in FIG. 5, described later, can be used in either d-c or a-c circuits since it will permit electric-current flow in either direction and it acts to limit transient currents in either direction of flow. There now follows a discussion of the two-terminal, current-limiting device 101A shown in FIGS. 4A and 4B.

The semiconductor device 101A comprises a crystalline-material wafer 102A in which is formed a plurality of horizontal channels $1A_1 \ldots 1K_1 \ldots$ (one channel only is shown in FIG. 4B) that are lightly doped (n-type dopant in FIG. 3A and 3B). The channels $1A_1$ etc., are bounded on one side by a substrate $22A_1$ containing a level of dopant that is higher than that of the channels $1A_1$ etc., and of the opposite type, that is, the substrate $22A_1$ contains a high level of p-type dopant in FIG. 4B. The channels $1A_1$, etc., are each bounded on the other side by a diffused gate region $21B_1$, one such gate region only being shown in FIG. 4B. The gate region $21B_1$ contains a high level of dopant introduced by diffusion at one major surface 7A of the wafer 102A and of the same type as that of the substrate $22A_1$. An entrance region $9A_1$ to the channel $1K_1$ and an exit region $9A'_1$ from the channel $1K_1$ are formed by highly doping the wafer 102A at each region of the surface 7A with a dopant of the same type as that of the channel and, again, the terms of entrance and the exit are used for convenience of explanation. The diffused gate $21B_1$ is disposed between each entrance and exit at the wafer surface and the gate $21B_1$ is electrically shorted to one or the other; in FIG. 4B the gate is shorted to the entrance region $9A_1$ by a first conductive terminal $3A_1$ forming a low-resistance contact to the regions $9A_1$ and $21B_1$ and, in this embodiment, by the fact that the n+ region $9A_1$ and the p+ region $21B_1$ are in contact; a second conductive terminal $4A_1$ forms a low-resistance contact to the region $9A'_1$. The substrate $22A_1$ is connected through a low-resistance conductor, indicated by the broken line 103, to the terminal $9A_1$: in a situation wherein the gate $21B_1$ is directly connected to the region $9A_1'$, rather than $9A_1$, the substrate is shorted to the terminal $4A_1$. Each channel in the device 101A acts as a field effect transistor with its gate shorted to the first conductive terminal $3A_1$, and as before and in the devices subsequently described herein, the dimension of the device and the levels of doping are chosen to give a device breakdown voltage $V_B$ that is much greater than its normal operating voltage $V_n$ and its pinch-off voltage $V_L$. Some typical dimensions are given in FIG. 4B for a device having external dimensions of 40 mils. Such device could have a value for $V_n \sim 0.7$ volts, and, again, preferably an $L/d$ ratio $\geq 4$, although $L/d < 4$ can be employed with degraded operation. With reference particularly to FIG. 4B, the channel lies in the zone generally limited by the dimensions L and the $d$, but it will be appreciated that the channel effect will extend slightly beyond these dimensions. Further, whereas the n+ regions 9A, etc., in FIG. 3A were in direct contact with the channels, in FIG. 4B the n+ region $9A_1$, etc. and $9'_1$, etc., are placed in electrical communication with the channels by regions that cannot rightly be called channels since the term "channel" herein is employed to designate a part of the device that has restricted (i.e., small) cross dimensions across which depletion regions, at some level of transmitted current, applies a pinch-off effect to the current in that the voltage drop across the channel rises drastically without any significant increase in current, as shown in FIG. 1. The channels $1A_1$, etc., are serially connected to form a closed loop, as now explained in connection with FIG. 4A wherein the channels are designated $1A_1$, $1B_1, \ldots 1K \ldots$ Some further explanation is needed with regard to FIG. 4A which can best be characterized as a schematic representation wherein the solid line, other than the outer-most border lines of the device, represent the channel regions and the broken lines represent the entrance and the exit regions. The designation $3A_1$ is employed to denote the first conductive terminal as well as all the conductive fingers connected thereto; the designation $4A_1$ is employed to denote the second conductive terminal as well as all the conductive fingers connected thereto. The oxide coating labeled $23_A$ in FIG. 4B, that acts to insulate and protect the various active elements at the major surface 7A as well as a chemically passivating layer for all exposed surfaces of the wafer 102A, is not included in FIG. 4A. Two sides of the device are labeled $20A_1$, and $20B_1$ and two edges are labeled $11A_1$ and $11B_1$. To reduce cluttering in the figure, channels $1A_1$, $1B_1$, and the channel $1K_1$ only are marked. The channels $1A_1$, $1B_1 \ldots 1K_1 \ldots$ are interconnected at the ends of each by short channels 25A at one end and by other short channels 26A at the other end. A peripheral channel $1A_n$ surrounds all the channels $1A_1 \ldots$ and is connected by further short channels to the inner array of channels comprising $1A_1 \ldots,$ forming a closed loop as is required for present purposes. The peripheral channel $1A_n$ serves to force electric current to flow between the active inner elements of the device 101A in the required manner. The channel width Z in FIG. 4A can vary from channel to channel, but that alone is not particularly important when it is recalled that it is the total length N·Z (where N is any number greater than one and the present invention contemplates multiple channels where N is at least $\sim$ 10 or more) of the combined channels that is important here.

Figure 6:
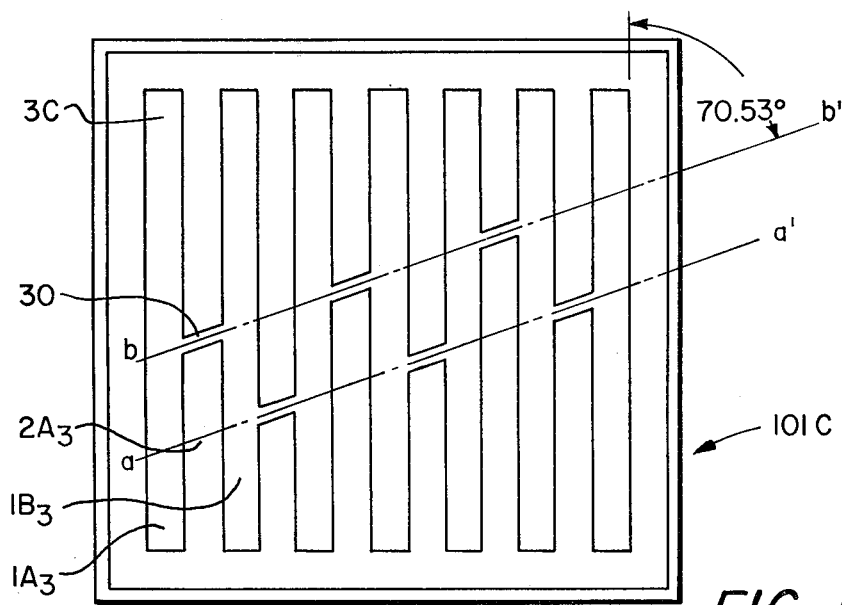
FIG. 6 is a top view of a further modification of the device of FIG. 3A and shows a device having vertical channels that are interconnected by short bridging channels.

The semiconductor device 101B shown in FIG. 5 comprises a crystalline-material wafer 102B having at its first major surface 7B two groups of channels $1A_2$, $1B_2 \ldots$ and $1P_2$, $1Q_2 \ldots$, respectively, four channels only being shown in each group in FIG. 5. The surface 7B is grooved in the same manner as is the upper surface of the device 101 and the channels contain an n-type dopant like the device 101. A first conductive terminal 3B is in low-resistance contact through n+ contact regions $9A_2, 9B_2 \ldots$ with the channels $1A_2, 1B_2 \ldots$, respectively, of the first group of channels and a second conductive terminal 4B is in low-resistance contact through n+ contact regions $9P_2, 9Q_2 \ldots$ with the channels $1P_2, 1Q_2 \ldots$, respectively, of the second group of channels. The major surface 7B again has a layer, the p+ layer designated $21B_2$ here, comprising a high level of dopant of the opposite type to that of the channels; the layer $21B_2$ covers all the surface 7B except the contact regions $9A_2, 9B_2 \ldots$ and $9P_2, 9Q_2 \ldots$ and a zone generally designated 28 between the two groups of channels. The zone 28 contains an insulator 27. It will be appreciated that the p+ layer $21B_2$ in the walls of the channels $1A_2$, etc., is a gate shorted to its respective terminal whereas it is more correctly stated that layer $21B_2$ between the terminals 3B and 4B and the bulk n-type material numbered 29 performs an insulating function rather than a gating function when the current is flowing in the sense for which the device can limit it. Each channel $1A_2 \ldots$ in one group acts as a field effect transistor with its gate shorted to the first conductive terminal 3B and each channel $1P_2 \ldots$ in the other group acts as a field effect transistor with its gate shorted to the second conductive terminal 4B. The Z dimension (not shown) is into the paper in FIG. 5 and the ratios before discussed hold here, as well. It will undoubtedly be appreciated at this juncture that even though a dimension such as, for example, L is applied to all the channels of a device, in the actual device all channels may not have identical dimensions; thus a ratio $Z/L \geq 100$ as to the device 101B means that the summed widths of all the channels (here $8 \cdot Z$) divided by the average channel length L must be at least 100. A single device 101B can be used to conduct and limit either d-c current or a-c current, whereas two of the devices 101, for example, connected back-to-back or vice versa, are needed in a-c circuits, A device can be employed in a situation in which requirements dictate that the grooves are not filled and/or the vertical metallic fingers are not thick enough to provide low electrical resistance. In such case, a device such as that shown at 101C in FIG. 6 can be employed. The device 101C includes short channels that interconnect the adjacent channels electrically and provide a continuous flat contact surface between the channels and the terminal 3C. One short channel only, the channel 30 that bridges the groove $2A_3$ between the channels $1A_3$ and $1B_3$, is labeled. The short channels are formed along a second set of crystallographic planes perpendicular to the upper major surface of the device as before. The planes of the short channels are at an angle of 70.53° to the main channels (in silicon devices); see lines $aa'$ and $bb'$ in the figure. Typically, the L dimension of the short channels 30 ... will be the same as the main channels $1A_3 \ldots$, but the $d$ dimension, specifically, should be no larger than that dimension in the main channels. The short channels may have contact regions like the contact regions 9A, 9B ....

The two-terminal device designated 101D in FIG. 7 has conductive terminals 3D and 4D in low resistance electrical contact with the upper and lower major surfaces, respectively (marked 7D and 8D, respectively), of a wafer 102D at a contact region $9A_3$ and a gate contact 34D and a substrate region 29D, respectively, of the wafer 102D. The device 101D is a multi-channel device wherein the channels marked $1A_4, 1B_4 \ldots$ are vertical channels within the bulk of the wafer disposed between gate regions 31A, 31B .... The gates 31B .. . 31F are cylindrical, and preferably circular cylindrical with the cylinder axis oriented in the Z direction. Again the channel and gate widths are Z and the channel length and thickness are L and $d$, respectively. The channels $1A_4 \ldots$ are in electrical communication with the substrate portion 29D of the wafer through a lightly doped lower region 32D having the same type dopant as that of the channels. The substrate 29D is formed by highly doping the wafer 102D with the same type dopant as that of the channels. The channels $1A_4 \ldots$ are also in electrical communication with the upper major surface 7D through a lightly doped upper portion 33D of the wafer within the wafer bulk and the contact region $9A_3$ which is highly doped with the same dopant as that of the channels. The upper portion 33D contains the same dopant as the channels and, as noted, is lightly doped. The buried gate regions 31B ... 31F are in electrical low-resistance communication with the major surface 7B through a gate contact composed of same type dopant as that of the buried gates, that is, the gate contact comprises the gates 31A and 31G that are in low-resistance electrical contact with the terminal 3D and which are joined together by a heavily doped p+ region 34D at the back and at the edges of the device 101D. The region 34D also joins the buried gates 31B ... 31F electrically together. The device 102D is formed by diffusion and epitaxial overgrowth.

Figure 8:
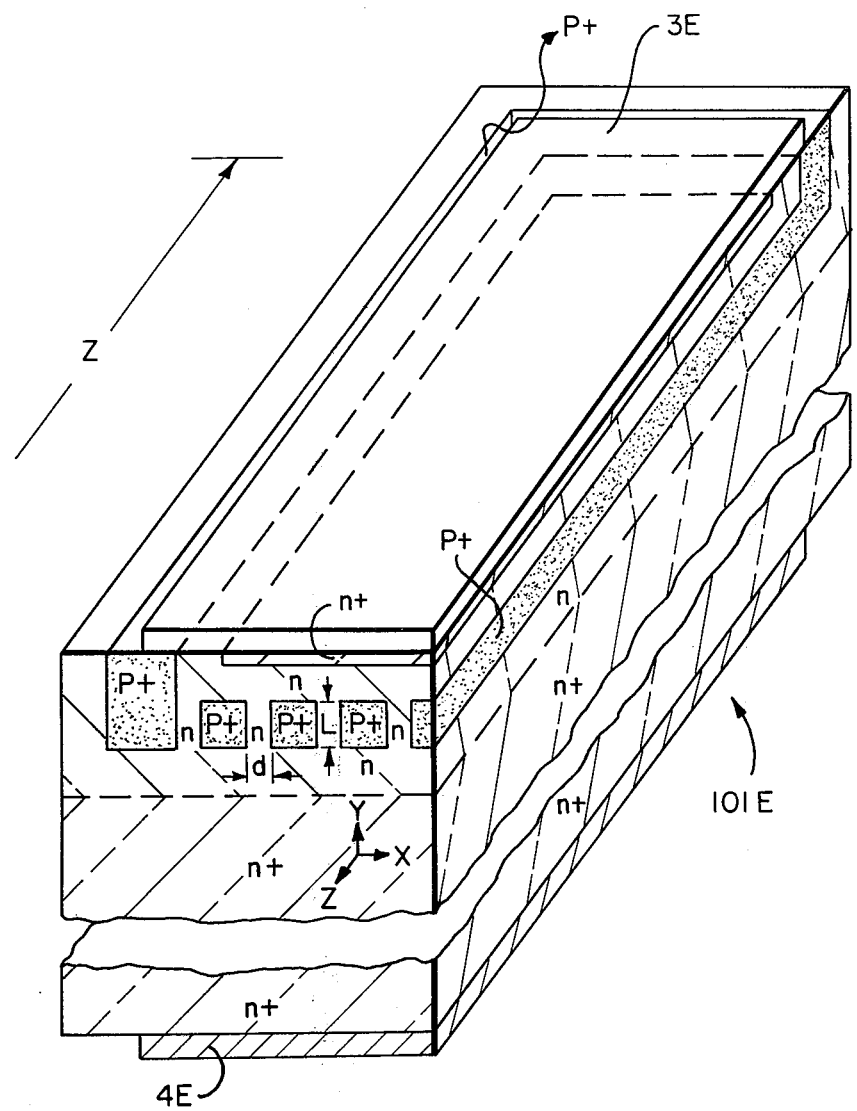
FIG. 8 is an isometric view of a device that is quite similar to that of FIG. 7 except that the ion implantation is employed in the formation thereof.

The two-terminal device shown at 101E in FIG. 8 is quite similar to the device 101D; so no detailed description need be made. Current flow in the device is between electrodes 3E through lightly doped channels formed between the p+ regions which are the gate regions as before. The gate regions are formed by ion implantation.

Figure 9A:
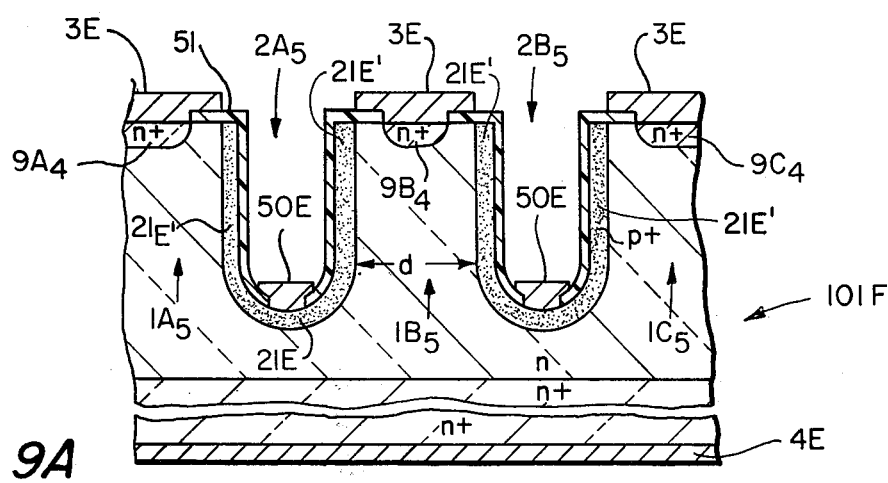
FIG. 9A is a vertical, section, partial view of a grooved device somewhat similar to that shown in FIG. 3A, but whereas the gate is internally shorted to one of the two-terminals within the device of FIG. 3A, the gate in FIG. 9A has an external terminal.
Figure 9B:
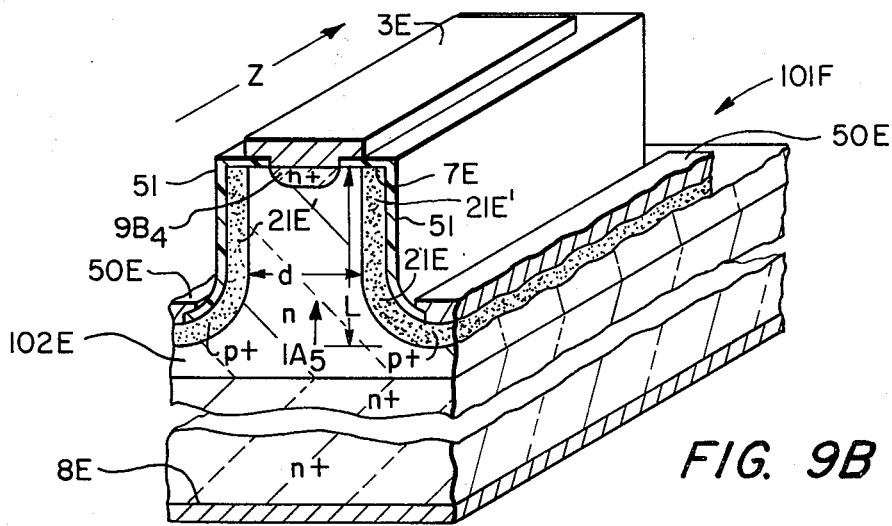
FIG. 9B is an isometric view of a part of the device shown in FIG. 9A.

Whereas the previously described semiconductors are two-terminal devices, the device marked 101F in FIGS. 9A and 9B has three-terminals: 3E, 4E and 50E, the terminals 3E and 4E being at the upper major surface 7E and lower major surface 8E of the wafer 102E that forms the body of the device. The wafer 102E has in the surface 7E a plurality of N channels $1A_5, 1B_5$, etc., having length L, width Z and thickness $d$; again, the ratio $L/d \geq 4$ is needed to provide a device having good current and voltage characteristics, but lower $L/d$ ratios may be employed if the degradation in operating characteristics can be tolerated. And, again, a large Z/L ratio ($\sim 100$ and up) is needed to give the high current-carrying capacity needed for power-type systems. Each channel functions as a field effect transistor, as before, but here its gage (i.e., the p+ regions marked 21E') is a low-resistance electrical contact with the third conductive terminal 50E. Like in the device 101, the channels $1A_5 \ldots$ are separated from one another by grooves $2A_5 \ldots$ formed along parallel crystallographic planes of the crystalline-material of which the wafer 102E is made. The channels $1A_5 \ldots$ are composed of lightly-doped, n-type material and the gates 21E' are highly doped p-type material. The first terminals 3E are placed in low-resistance electrical contact through n+ contact regions $9A_4, 9B_4 \ldots$ with the channels $1A_5$ and, the terminal 4E is in low-resistance electrical contact with the n+ substrate of the wafer 102E. It should be appreciated, on the basis of the foregoing explanation, that the plurality of channels here, and in the previously-described devices, conceptually could be one long channel and, indeed, the device of FIGS. 4A and 4B even looks like one long channel, with its short connecting channels. However, for purposes of this specification, the device 101A is considered to have a plurality of channels as do, also, the other devices herein. It is not seen as practical to have a device with one straight, long channel and a ratio Z/L of 100 or more and preferably ~1000.

Turning again to the device 101E, there is an electrical insulating layer 51 (which, if the wafer 102E is silicon, can be $SiO_2$) covering all the major surface 7E with the exception of the areas of electrical interconnection between the electric-contact regions $9A_4$ . . . and the first conductive terminal 3E and the highly doped layer shown at 21E and the third conductive terminal 50E. Again, the gate 21E' is the portion of the layer 21E located in the walls bounding the channels $1A_5$ . . . and the gate 21E' is thusly placed in good electrical contact with the terminal 50E. Electric current flow in the device 101F is through the terminal 4E, the n+ substrate, the n region below the channels, through the channels $1A_5$ . . . wherein the current-limiting features of the device are found and out through the contact regions $9B_4$ . . . and the terminal 3E. Modulation of that current is effected by appropriate biasing by the terminal 50E.

The current-limiting devices herein described can be used to limit transient currents to two or three times normal current. The load in FIG. 2 can be, for example, a three-phase motor, in which case the devices labeled CLD in FIG. 2 in each phase would limit the starting current of the machine to some pre-determined level. Such devices can be used, as well, to limit in-rush of current to light bulbs, as a group, or individually, as by installing two devices like the device 101, for example, connected in series back-to-back or vice versa, in the base of the bulb, or a number of devices 101B in parallel to meet high normal current requirements and/or in series to meet high voltage requirements.

The terminals 3 and 4 can be aluminum, but other metals or metal alloys or electrically conductive materials can be used. The crystallographic material in the examples is silicon, but other materials (e.g., gallium arsenide, germanium) can be used.

Further modifications of the invention herein disclosed will occur to persons skilled in the art and all such modifications are deemed to be within the scope of the invention as defined by the appended claims.

What is claimed is:

1. A two-terminal, current-limiting device for use in an electric circuit, that comprises: a crystalline-material semiconductor wafer having at one major surface thereof a plurality of N channels of length L, width Z and thickness $d$, wherein the ratio NZ/L is at least one hundred and wherein $L/d \geq 3$, said device further comprising a gate region formed in the side walls of each channel and a source terminal and a drain terminal, the gate region of each channel being internally shorted to one of the terminals of the device.

2. A device as claimed in clain 1 in which each channel has a thickness of $d$ and in which the ratio $L/d \geq 3$.

3. A device as claimed in claim 1 in which each channel has a thickness $d$ and in which the ratio $L/d \geq 4$.

4. A device as claimed in claim 1 in which a first conductive terminal is in low resistance contact with the wafer at said one major surface and a second conductive terminal is in low resistance contact with the wafer at the second major surface of the wafer, one conductive terminal being the source terminal and the other being the drain terminal, in which each channel of the plurality of channels is a lightly-doped mesa-like region of the crystalline-material wafer bounded by flat walls substantially parallel to one another and comprising said crystalline-material with a high level of dopant of opposite type to that of the channel, to form gate regions the channels being in electrical communication with a substrate portion of the wafer through a lightly-doped region having the same type and level of dopant as the channels, the portion of the wafer forming the substrate being highly doped with a dopant of the same type as that of the channels, and in which the second conductive terminal forms low-resistance contact with the substrate.

5. A device as claimed in claim 4 in which the channels are separated from one another by grooves of length L, width Z and thickness $d_2$, formed along crystallographic planes of the crystalline-material wafer, the planes being perpendicular to the major surfaces of the wafer, said walls being at the region of the interface between the channels and the grooves adjacent the respective channel, in which the entrance region to or exit region from each channel is an electric surface channel contact formed by highly doping the wafer at said region with a dopant of the same type as that of the channels, in which the first conductive terminal is a first conductive terminal covering said one major surface and making low-resistance electric contact with said electric surface channel contact and with said crystalline material with a high level of dopant of opposite-type to that of the channels, but electrically insulated from the side or sides of the wafer, in which the second conductive terminal is a second conductive terminal covering said second major surface, but electrically insulated from the side or sides of the wafer, each of the channels acting as a field effect transistor with its gate, the walls of the channels, being shorted to the first conductive terminal.

6. A device as claimed in claim 5 and having an electrically-insulating, chemically-passivating, and heat resistant mechanical protector covering the sides of the device and mechanically interconnecting the first conductive terminal and the second conductive terminal.

7. A device as claimed in claim 5 in which the dimensions of the device and the levels of dopant are such that the breakdown voltage $V_b$ of the device is much greater than its normal operating voltage $V_n$ and its pinch-off voltage $V_L$.

8. A device as claimed in claim 7 and having an electrically-insulating, chemically-passivating and heat-resistant mechanical protector covering the sides of the device and mechanically interconnecting the first conductive terminal and the second conductive terminal.

9. A device as claimed in claim 5 that further includes short channels bridging each groove thereby to interconnect adjacent channels electrically and provide a continuous flat contact surface to all the channels, said short channels being formed along a second set of crystllographic planes perpendicular to said first major surface.

10. A device as claimed in claim 4 in which said thickness $d$ and the levels of dopant of said channels and said gate regions are such that the normal operating voltage $V_n$ of the device is very small and much smaller than its breakdown voltage $V_o$ and the relationship between pinch-off current and normal current of the device is suited for transient-current limiting, and in which the gate regions are shorted internally to the first conductive terminal.

11. A device as claimed in claim 1 in which the channels are horizontal and lightly doped, the horizontal channels being bounded on one side by a substrate containing a level of dopant that is higher than that of the channels and of the opposite type to that of the channels and on the other side by a diffused gate region at one major surface of the wafer of the same type dopant as that of the substrate, the diffused gate regions being serially connected to form a closed loop, and the other major surface of the wafer being the outside surface of the substrate.

12. A device as claimed in claim 11 having an entrance region to and an exit region from each channel containing an ohmic electric contact region formed by highly doping the wafer at each region with a dopant of the same type as that of the channels, the entrance and exit regions being at said one major surface of the wafer, the diffused gate region being disposed between the entrance region and the exit region of the channel, the diffused gate region being electrically shorted to either the entrance region or to the exit region and to the substrate, in which a first conductive terminal is in low resistance electric contact with the entrance region, in which a second conductive terminal is in low resistance electric contact with the exit region, each channel acting as a field effect transistor with its gate shorted to one or the other conductive terminal, the dimensions of the device and levels of doping being such that the breakdown voltage $V_b$ of the device is much greater than its normal operating voltage $V_n$ and its pinch-off voltage $V_L$, and having an electrically-insulating and chemically-passivating layer covering all said one major surface except the areas of electrical interconnection between the conductive terminals and said ohmic electric contact regions.

13. A device as claimed in claim 1 in which the channels are lightly doped portions within the bulk of the wafer disposed between gate regions containing a high level of dopant of opposite type to that of the channels, the channels being in electrical communication with a substrate portion of the wafer through a lightly doped lower region having the same type dopant as that of the channels, the portion of the wafer forming the substrate being highly doped with the same type dopant as that of the channels, the channels also being in electrical communication with a first major surface of the wafer through a lightly doped upper portion of the wafer and a highly doped portion of the wafer at said first major surface that forms a surface channel contact, both of the latter portions being of the same type dopant as that of the channels, a first conductive terminal in low-resistance contact with said first major surface of the wafer, a second conductive terminal in a low-resistance contact with the outer surface of the substrate which is the second major surface of the wafer, one of the conductive terminals being the source terminal and the other conductive terminal being the drain terminal, said gate regions being in low-resistance electrical communication with said first major surface through a gate contact composed of a highly doped portion of the wafer having the same type dopant as that of the gates, the first conductive terminal being in low-resistance contact with both the gate contact and the surface channel contact, each channel acting as a field effect transistor with its gate shorted to the first conductive terminal, the dimensions of the device and the levels of dopant being such that the breakdown voltage $V_b$ of the device is much greater than its normal operating voltage $V_n$ and its pinch-off voltage $V_t$.

14. A device as claimed in claim 13 in which said gate regions are formed by diffusion and said lightly doped upper portion is formed by epitaxial growth.

15. A device as claimed in claim 13 in which said gate regions are formed by ion implantation.

16. A semiconductor device that comprises a crystalline-material semiconductor wafer having in a first major surface a plurality of N channels separated from each other by grooves formed along parallel crystallographic planes of the crystalline-material, said planes being perpendicular to said surface, each channel being bounded by flat walls, substantially parallel to one another, the material forming each channel being lightly doped and the material forming the boundary walls being highly doped with an opposite-type dopant to that of the channels to form a gate in each wall, said opposite-type dopant covering all said first surface of the wafer with the exception of channel electric-contact regions, said regions being thin, highly doped layers with the same type dopant as that of the channels, a second major surface of the semiconductor wafer formed by a highly doped substrate with the same type dopant as that of said channels, the substrate forming the part of the wafer found between the second surface and the vicinity of said channels, a first conductive terminal in electrical contact with the first surface of the semiconductor wafer, with the exception of the edges, and making low-resistance electrical contact with all the parts of the first surface of the semiconductor wafer which is covered by it, and a second conductive terminal in contact with the second surface of the wafer, with the exception of the edges, and making low-resistance electrical contact with all the parts of the second surface of the semiconductor wafer which is covered by it, each channel of said plurality of channels having a length L, width Z and thickness $d$ such that the ratio $NZ/L \geq 1$ and $L/d \geq 3$, each said channel acting as a field effect transistor with its gate shorted to the first conductive terminal.

17. A semiconductor device as claimed in claim 16 that further includes an electrically-insulating, chemically passivating and heat resistant mechanical protector covering the edges and sides of the device and mechanically interconnecting the first conductive terminal and the second conductive terminal.

18. A device as claimed in claim 16 in which the dimensions of the device and the levels of dopant are such that the breakdown voltage $V_b$ of the device is much greater than its normal operating voltage $V_n$ and its pinch-off voltage $V_L$.

19. A device as claimed in claim 18 having an electrical-insulating, chemically-passivating and heat-resistance mechanical connector covering the sides of the device and mechanically interconnecting the first conductive terminal and the second conductive terminal.

20. A semiconductor field-effect device that comprises a crystalline-material semiconductor wafer having in a major surface two groups of N channels per group, the major surface being grooved so that each channel in each group is separated from an adjacent channel by a groove, each groove being formed along parallel crystallographic planes perpendicular to said major surface, each channel having flat walls, substantially parallel to one another, the material forming each wall being lightly doped and the material forming the boundary wall being highly doped with an opposite-type dopant to that of the channels to form gate regions that bound the channel, an isolating zone between the two groups of channels, a first conductive terminal at a part of the major surface of the wafer occupied by one group of channels and in low-resistance electrical communication therewith, a second conductive terminal at a part of the major surface of the wafer occupied by the other group of channels and in low-resistance electrical communication therewith, each channel in said one group acting as a field effect transistor with its gate shorted to the first conductive terminal and each channel in the other group acting as a field effect transistor with its gate shorted to the second conductive terminal, the channel dimensions being length L width Z and thickness $d$, wherein NZ/L $\geq$ 100 and L$d$ $\geq$ 3.

21. A device as claimed in claim 20 in which low-resistance electrical communication between the conductive terminals and the respective channels is through a highly doped contact region of the channel contiguous to the respective terminal and containing the same-type dopant as that of the channels and in which the isolating zone contains an insulation.

22. A device as claimed in claim 21 in which said opposite-type dopant forms a boundary layer at all said major surface except said contact regions and said isolating zone.

23. A semiconductor device as claimed in claim 22 having an electrically-insulating, chemically-passivating and heat-resistance mechanical protector at the side or sides of the wafer as well as said zone.

24. An electric system having a plurality of two-terminal, current limiting devices, each device comprising a crystalline-material semiconductor wafer having a source, a drain and gate regions, electrical connection to each device being through a source terminal and a drain terminal, the wafer further having a plurality of N channels bounded by said gate regions, each channel having an average length L, a width Z, and a thickness $d$, each channel acting as a field effect transistor with its gate shorted to one terminal of the device, the dimensions of the device and the levels of dopant being such that the breakdown voltage $V_b$ of each device is much greater than its normal operating voltage $V_n$ and its pinch-off voltage $V_L$, the ratio NZ/L being at least 100 and L/$d$ $\geq$ 3.

25. An electric system as claim 24 in which the devices are interconnected in a manner to pass and limit d-c current.

26. An electric system as claimed in claim 25 in which the devices are interconnected in series and/or parallel to meet current and voltage requirements of the system in excess of the capability of a single device.

27. An electric system as claimed in claim 24 in which the devices are interconnected in a manner to pass and limit a-c current.

28. An electric system as claimed in claim 27 in which the devices are interconnected in series and/or parallel to meet current and voltage requirements of the system in excess of the capability of a single device.

29. A semiconductor device that comprises a crystalline-material semiconductor wafer having in a first major surface a plurality of channel means separated from each other by grooves formed along parallel crystallographic planes of the crystalline-material, said planes being perpendicular to said first major surface, each channel means being bounded by flat walls substantially parallel to one another, the material forming each channel means being lightly doped and the material forming the boundary walls being highly doped with an opposite-type dopant to that of the channel means, said opposite-type dopant covering substantially all said first major surface of the wafer with the exception of electric-contact regions, said electric-contact regions being thin, highly doped layers with the same type dopant as that of the channels, each thin, highly doped layer electrically contacting one of the channel means, a second major surface of the semiconductor wafer formed by a highly doped substrate with the same type dopant as that of said channel means, the substrate forming the part of the wafer found between the second major surface and the vicinity of said channel means, a first conductive terminal in low-resistance electrical contact with the electric-contact regions of said channel means, a second conductive terminal in low-resistance electrical contact with the second surface of the wafer and making low-resistance electric contact with all parts of the second surface of the semiconductor wafer which is covered by it, and a third conductive terminal making low-resistance electric contact with said highly doped regions with opposite-type dopant to that of the channels, said channel means having length L, width Z, and thickness $d$, the ratio NZ/L being at least a hundred and L/$d$ $\geq$ 3, each channel means acting as a field effect transistor that acts to limit high transient currents therethrough and having a breakdown voltage $V_B$ much greater than its normal operating voltage $V_N$ and current-limiting voltage $V_L$.

30. A device as claimed in claim 29 having an electrically-insulating and chemically-passivating layer covering all said first major surface with the exception of the areas of electrical interconnection between said electric-contact regions and the first conductive terminal and said highly doped regions with opposite-type dopant and the third conductive terminal.

31. A current-limiting device for use in an electric circuit, that comprises:
a crystalline-material semiconductor wafer comprising source means and drain means and having at one major surface thereof at least one source-to-drain channel means of length L, and width Z, wherein the ratio Z/L is at least 100.

32. A device as claimed in claim 31 in which the channel means has a thickness $d$ and in which the ratio L/$d$ $\geq$ 4.

33. A device as claimed in claim 31 in which the channel means has a thickness $d$ and in which the ratio L/$d$ $\geq$ 3.

34. A device as claimed in claim 33 in which the channel means comprises a portion of the crystalline material containing one type dopant bordered by walls of the crystalline material containing an opposite-type dopant to that of the channel means and performing a gate function.

35. A device as claimed in claim 34 in which the dimensions of the device and the levels of dopant are such that the breakdown voltage $V_b$ of the device is much greater than its normal operating voltage $V_n$ and its pinch-off voltage $V_L$.

36. A device as claimed in claim 33 and having an electrically-insulating, chemically-passivating and heat-resistant mechanical protector covering the sides of the device.

37. A device as claimed in claim 36 having terminal means comprising two terminals to provide input to and output from the device, the walls of crystalline material that perform the gate function being internally shorted to one of the two terminals, thereby providing a two-terminal device in which the channel acts as field effect transistor with its gate internally shorted to one of the terminals.

38. A device as claimed in claim 36 having terminal means comprising a first terminal and a second terminal to provide input to and output from the device and a third terminal electrically connected through a low-resistance connection to the walls of the channel means to permit external control of the gating function.

39. A field effect semiconductor device for use in electrical power circuits that comprises: a source, a drain, gate regions and a plurality of N source-to-drain channels bounded by said gate regions, said channels having an average length L, width Z and thickness $d$, the said channels being formed such that $NZ/L$ 1000 and $L/d \geq 3$ to provide a device which presents low resistance to electric current at normal levels of current and very high resistance to electric current at high levels of current, thereby to limit the current through said device.

* * * * *